United States Patent
Nagano

(10) Patent No.: US 11,631,986 B2
(45) Date of Patent: Apr. 18, 2023

(54) METHOD FOR CHARGING SECONDARY BATTERY

(71) Applicant: TOYOTA JIDOSHA KABUSHIKI KAISHA, Toyota (JP)

(72) Inventor: Aiko Nagano, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 182 days.

(21) Appl. No.: 16/781,032

(22) Filed: Feb. 4, 2020

(65) Prior Publication Data
US 2020/0321795 A1 Oct. 8, 2020

(30) Foreign Application Priority Data
Apr. 3, 2019 (JP) ............... JP2019-071084

(51) Int. Cl.
H02J 7/04 (2006.01)
H02J 7/16 (2006.01)
H01M 10/48 (2006.01)
G01R 27/14 (2006.01)
H01M 10/052 (2010.01)

(52) U.S. Cl.
CPC ............. *H02J 7/04* (2013.01); *G01R 27/14* (2013.01); *H01M 10/052* (2013.01); *H01M 10/48* (2013.01)

(58) Field of Classification Search
USPC ................... 320/101, 103, 160, 162
See application file for complete search history.

(56) References Cited

U.S. PATENT DOCUMENTS

| | | | |
|---|---|---|---|
| 2008/0122399 A1* | 5/2008 | Nishino | H02J 7/0069 320/103 |
| 2010/0033132 A1 | 2/2010 | Nishi et al. | |
| 2011/0084702 A1* | 4/2011 | Mori | H01M 10/441 324/430 |
| 2011/0187312 A1* | 8/2011 | Yamamoto | H01M 10/48 320/101 |
| 2016/0344219 A1 | 11/2016 | Lee et al. | |
| 2017/0246963 A1* | 8/2017 | Lee | H01M 10/46 |
| 2017/0263984 A1* | 9/2017 | Fujita | H01M 10/482 |
| 2018/0062147 A1* | 3/2018 | Onoda | H01M 50/20 |
| 2018/0076633 A1* | 3/2018 | Fujita | H01M 10/425 |
| 2018/0131198 A1* | 5/2018 | Liu | H02J 7/0021 |

(Continued)

FOREIGN PATENT DOCUMENTS

| CN | 105794079 A | * | 7/2016 |
|---|---|---|---|
| JP | 2000-270491 A | | 9/2000 |

(Continued)

OTHER PUBLICATIONS

Gu et al., Thermal-Electrochemical Coupled Modeling of a Lithium-Ion Cell, J. Electrochem. Soc., 2000.

*Primary Examiner* — Brian Ngo
(74) *Attorney, Agent, or Firm* — Dickinson Wright, PLLC

(57) ABSTRACT

It is an object of the invention to provide a method for efficiently charging a secondary battery. The method of the disclosure is a method for charging a secondary battery that includes step (A) for measuring an internal resistance of the secondary battery, and step (B) for increasing or decreasing the maximum charging voltage of the secondary battery in accordance with increase or decrease of the measured internal resistance.

6 Claims, 1 Drawing Sheet

(56) References Cited

U.S. PATENT DOCUMENTS

2018/0208062 A1\* 7/2018 Kanada ................... B60L 58/25
2019/0207215 A1\* 7/2019 Tokoro
2020/0108733 A1\* 4/2020 Oguma ................... H02J 7/007

FOREIGN PATENT DOCUMENTS

| JP | 2003-009407 A | 1/2003 |
| JP | 2008-059910 A | 3/2008 |
| JP | 2010-271267 A | 12/2010 |
| JP | 2014-096871 A | 5/2014 |
| JP | 2015-092433 A | 5/2015 |
| JP | 2017-162613 A | 9/2017 |

\* cited by examiner

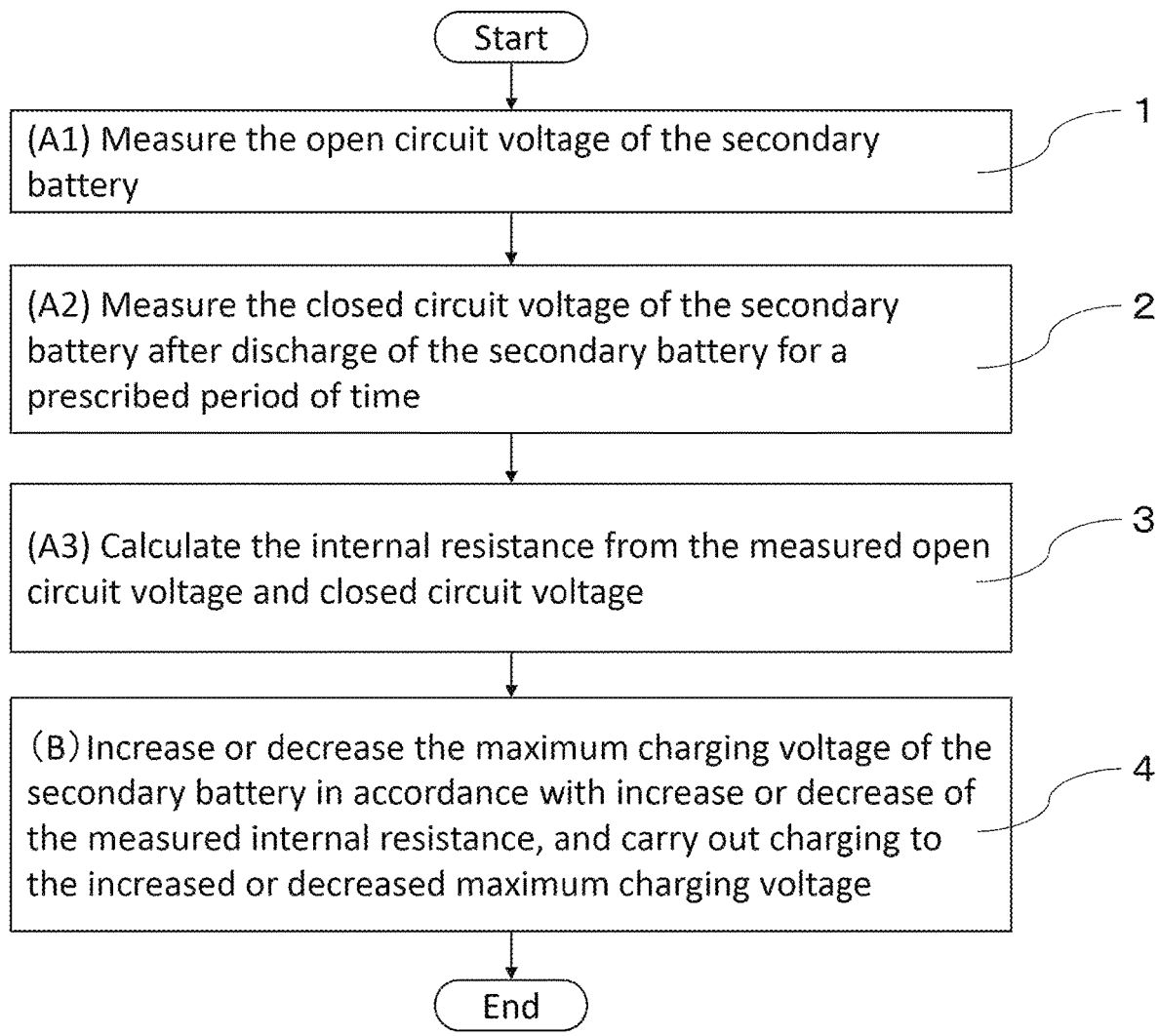

METHOD FOR CHARGING SECONDARY BATTERY

FIELD

The present disclosure relates to a method for charging a secondary battery.

BACKGROUND

Various methods of controlling secondary batteries have been studied with the goal of more efficiently utilizing the secondary batteries.

PTL 1, for example, discloses a method for controlling an assembled battery comprising multiple secondary batteries, wherein the chargeable amount of each secondary battery as the difference between the current storage amount of the secondary battery and the storage amount at maximum voltage is calculated.

PTL 2 discloses a method for controlling a secondary battery wherein the state estimation value, representing the state of the battery, is successively calculated according to a battery model that allows dynamic estimation of the internal state of the secondary battery based on a value detected by a sensor provided in the secondary battery. The same publication describes using the Newman model as the battery model.

The Newman model is explained in NPL 1.

Various other methods of controlling secondary batteries are also known, such as with the secondary battery module disclosed in PTL 3, for example, wherein the structural unit cells are short circuited to reduce variation in the state of charge (SOC) between the structural unit cells.

CITATION LIST

Patent Literature

[PTL 1] Japanese Unexamined Patent Publication No. 2014-96871
[PTL 2] Japanese Unexamined Patent Publication No. 2008-59910
[PTL 3] Japanese Unexamined Patent Publication No. 2010-271267

Non-Patent Literature

[NPL 1] W. B. Gu and C. Y. Wang, Thermal-electrochemical coupled modeling of a lithium-ion cell, J. Electrochem. Soc., 2000

SUMMARY

Technical Problem

The inventors of the present disclosure have found that the charge capacity of a secondary battery is sometimes lowered when the secondary battery undergoes degradation. It is an object of the present disclosure to provide a method of charging a secondary battery that eliminates this problem.

Solution to Problem

The present inventors have found that the aforementioned object can be achieved by the following means:

<Aspect 1>
A method for charging a secondary battery, wherein the method includes the following steps:
(A) measuring the internal resistance of the secondary battery, and
(B) carrying out charge while increasing or decreasing the maximum charging voltage of the secondary battery in accordance with increase or decrease of the measured internal resistance.

<Aspect 2>
The method of charging a secondary battery according to aspect 1, wherein in step B, the maximum charging voltage of the secondary battery is increased or decreased from the initial maximum charging voltage in accordance with increase or decrease of the measured internal resistance from the initial internal resistance.

<Aspect 3>
The method of charging a secondary battery according to aspect 1 or 2, wherein step A includes:
(A1) measuring the open circuit voltage of the secondary battery,
(A2) measuring the closed circuit voltage of the secondary battery after discharge of the secondary battery for a prescribed period of time, and
(A3) calculating the internal resistance from the measured open circuit voltage and closed circuit voltage.

<Aspect 4>
The method of charging a secondary battery according to any one of aspects 1 to 3, wherein the secondary battery is an all-solid-state second battery containing lithium titanate as a negative electrode active material.

<Aspect 5>
The method of charging a secondary battery according to any one of aspects 1 to 4, wherein step B includes:
not increasing or decreasing the maximum charging voltage if the increase or decrease in the measured internal resistance from the initial internal resistance is no greater than a threshold value, and increasing or decreasing the maximum charging voltage if the increase or decrease in the measured internal resistance from the initial internal resistance exceeds the threshold value.

<Aspect 6>
The method of charging a secondary battery according to any one of aspects 1 to 5, which includes evaluating the replacement time for the secondary battery in accordance with increase or decrease in the measured internal resistance from the initial internal resistance.

Advantageous Effects of Invention

According to the present disclosure it is possible to provide a method for efficiently charging a secondary battery.

BRIEF DESCRIPTION OF DRAWINGS

FIG. 1 is a flow chart of a first embodiment of the disclosure.

DESCRIPTION OF EMBODIMENTS

Embodiments of the disclosure will now be explained in detail. The disclosure is not limited to the embodiments described below, however, and various modifications may be implemented within the scope of the gist thereof.

The method for charging a secondary battery according to the present disclosure includes the following steps (A) and (B):

(A) measuring the internal resistance of the secondary battery, and (B) carrying out charge while increasing or decreasing the maximum charging voltage of the secondary battery in accordance with increase or decrease of the measured internal resistance.

Without being limited to any particular principle, the principle by which the method of the disclosure allows efficient charging of a secondary battery is presumed to be as follows.

Charging of a secondary battery is generally faster with greater voltage application, but if the applied voltage is too high the secondary battery undergoes accelerated degradation due to decomposition of the solid electrolyte, for example. Therefore, a maximum charging voltage is often set to control the secondary battery, in order to minimize such accelerated degradation while also allowing quick charging to the design charge capacity of the secondary battery.

Even with this type of control, however, in practice a secondary battery also has additional internal resistance that increases as the battery degrades in addition to the internal resistance due to charging, and therefore the voltage that actually contributes to charging of the secondary battery is a lower value than the maximum charging voltage, by the degree of voltage lowering due to the additional internal resistance, even if the entire secondary battery is charged up to the set maximum voltage.

Thus, when the secondary battery has degraded and the additional internal resistance has increased, the voltage that actually contributes to charging of the secondary battery decreases in accordance with the additionally increased internal resistance, often lowering the charge capacity.

However, the method of the present disclosure allows the internal resistance of the secondary battery to be measured before charging and allows the maximum charging voltage of the secondary battery to be increased in accordance with increase or decrease of the measured internal resistance, so that the voltage that actually contributes to charging of the secondary battery can be kept approximately constant, for example, thereby making it possible to minimize the reduction in the charge capacity during quick charging of the secondary battery, even when the internal resistance has additionally increased due to degradation of the secondary battery.

The method of the disclosure, the maximum charging voltage of the secondary battery may be increased or decreased from the initial maximum charging voltage in accordance with increase or decrease of the measured internal resistance from the initial internal resistance.

Incidentally, the method of the disclosure may include evaluating the replacement time for the secondary battery in accordance with increase or decrease in the measured internal resistance from the initial internal resistance.

This allows the user to determine the future replacement time for the secondary battery while simultaneously minimizing reduction in the charge capacity due to degradation of the secondary battery, so that the secondary battery can be utilized to the maximum extent until the time of replacement.

For the purpose of the present disclosure, the "initial internal resistance" means the internal resistance that a secondary battery has from the point of completion of the secondary battery, due to the actual materials composing the secondary battery and its structure. Therefore, the initial internal resistance may be the internal resistance of the secondary battery immediately after its production, for example. The value of the internal resistance can be determined, for example, by measuring the internal resistance of the secondary battery immediately after its production, but alternatively it may be the pre-measured value of the internal resistance of a secondary battery having a similar structure, or the value determined by pre-calculation based on the materials and structure of the secondary battery.

<Secondary Battery>

The secondary battery as the target of the method of the disclosure is not particularly limited. The secondary battery may be a liquid battery or an all-solid-state battery. The secondary battery as the target of the disclosure may also be an all-solid-state second battery containing lithium titanate (LTO) as the negative electrode active material.

<Step A>

Step A is a step of measuring the internal resistance of the secondary battery.

The method of measuring the internal resistance of the secondary battery in step A is not particularly restricted, and the measurement may be by any publicly known method. The internal resistance of the secondary battery may be measured using an internal resistance measuring device, for example.

As shown in FIG. 1, the method for measuring the internal resistance of the secondary battery in step A may be measurement by the following steps A1 to A3, for example:

(A1) measuring the open circuit voltage of the secondary battery 1, (A2) measuring the closed circuit voltage of the secondary battery after discharge of the secondary battery for a prescribed period of time 2, and (A3) calculating the internal resistance from the measured open circuit voltage and closed circuit voltage 3.

The internal resistance r of a secondary battery can potentially fluctuate depending on the state of charge inside the secondary battery, or, in the case of a lithium ion battery, for example, even on imbalance in the distribution of lithium inside the battery. Therefore, in order to more accurately assess the internal resistance r due to degradation of the secondary battery, it is necessary to reduce fluctuation in the internal resistance r due to the state of charge.

In step A2, imbalance in distribution of lithium inside the battery can be further decreased by discharging the secondary battery for a prescribed period of time, thus reducing the extent to which the state of charge inside the secondary battery contributes to the internal resistance r, and allowing the closed circuit voltage $E_c$ to be measured.

In step A3, the internal resistance r is calculated from the open circuit voltage $E_o$ and the closed circuit voltage $E_c$.

The internal resistance r, incidentally, can be calculated by the following formula (1), using the open circuit voltage $E_o$, the closed circuit voltage $E_c$ and the external resistance R.

$$r = R(E_o/E_c - 1) \tag{1}$$

In this formula, the external resistance R may be considered to be a constant. In the method of the disclosure, the internal resistance r only needs to be calculated to a degree allowing the increase or decrease to be assessed, and therefore it is not necessary to precisely determine the size of the external resistance R for measurement of the internal resistance r.

The method of measuring the internal resistance of the secondary battery by steps A1 to A3 above is advantageous especially when the secondary battery is an all-solid-state battery using LTO as the negative electrode active material. LTO has relatively low ionic conductivity, and a lithium distribution tends to be produced during charge-discharge in an all-solid-state battery that uses such a negative electrode active material.

The prescribed period of time in step A2 may be 1 second or longer, 5 seconds or longer, 10 seconds or longer or 30 seconds or longer, and 120 seconds or less, 90 seconds or less, 60 seconds or less, or 30 seconds or less. The contributions of the state of charge inside the secondary battery to the internal resistance may be further reduced if the discharge time is higher than such a value. Moreover, the time required for charging by the method of the disclosure may be shortened if the discharge time is lower than such a value.

<Step B>

As shown in FIG. 1, step B is a step in which charging is carried out while increasing or decreasing the maximum charging voltage of the secondary battery in accordance with increase or decrease of the internal resistance measured in step A 4.

The increase or decrease in the internal resistance may be increase or decrease from a prescribed reference value for the internal resistance measured in step A. The prescribed reference value may be the initial internal resistance, for example.

Increase or decrease of the maximum charging voltage of the secondary battery from the initial maximum charging voltage in accordance with increase or decrease of the internal resistance means that when the internal resistance has increased, the maximum charging voltage is increased from the initial maximum charging voltage in accordance with the degree of increase, or when the internal resistance has decreased, the maximum charging voltage is decreased from the initial maximum charging voltage in accordance with the degree of decrease.

Therefore, the increase or decrease in the maximum charging voltage in step B may be control such that the maximum charging voltage is not increased or decreased if the increase or decrease in the measured internal resistance from the initial internal resistance is no greater than a threshold value, and the maximum charging voltage is increased or decreased if the increase or decrease in the measured internal resistance from the initial internal resistance exceeds the threshold value. The specific method for carrying out such control may be calculation of the maximum charging voltage using the Newman model, for example.

The threshold value can be determined by appropriate design by a person skilled in the art based on the relationship between degradation of the secondary battery and reduction in the charge capacity.

When the maximum charging voltage is to be increased in step B, the maximum value for the maximum charging voltage is preferably ≤3.5 V, ≤3.2 V or ≤3.0 V (V v.s. Li—In), from the viewpoint of minimizing degradation of the solid electrolyte.

The invention claimed is:

1. A method for charging a secondary battery, wherein the method includes the following steps:
   (A) measuring the internal resistance of the secondary battery, and
   (B) increasing or decreasing the maximum charging voltage of the secondary battery in accordance with increase or decrease of the measured internal resistance, and carrying out charging to the increased or decreased maximum charging voltage;
   wherein step A includes:
      (A1) measuring the open circuit voltage of the secondary battery,
      (A2) measuring the closed circuit voltage of the secondary battery after discharge of the secondary battery for a prescribed period of time, and
      (A3) calculating the internal resistance from the measured open circuit voltage and closed circuit voltage.

2. The method for charging a secondary battery according to claim 1, wherein in step B, the maximum charging voltage of the secondary battery is increased or decreased from the initial maximum charging voltage in accordance with increase or decrease of the measured internal resistance from the initial internal resistance.

3. The method for charging a secondary battery according to claim 1, wherein the secondary battery is an all-solid-state second battery containing lithium titanate as the negative electrode active material.

4. The method for charging a secondary battery according to claim 1, wherein step B includes:
   not increasing or decreasing the maximum charging voltage if the increase or decrease in the measured internal resistance from the initial internal resistance is no greater than a threshold value, and increasing or decreasing the maximum charging voltage if the increase or decrease in the measured internal resistance from the initial internal resistance exceeds the threshold value.

5. The method for charging a secondary battery according to claim 1, which includes evaluating the replacement time for the secondary battery in accordance with increase or decrease in the measured internal resistance from the initial internal resistance.

6. A method for charging a secondary battery, wherein the method includes the following steps:
   (A) measuring the internal resistance of the secondary battery, and
   (B) increasing or decreasing the maximum charging voltage of the secondary battery in accordance with increase or decrease of the measured internal resistance, and carrying out charging to the increased or decreased maximum charging voltage;
   wherein step B includes:
      not increasing or decreasing the maximum charging voltage if the increase or decrease in the measured internal resistance from the initial internal resistance is no greater than a threshold value, and increasing or decreasing the maximum charging voltage if the increase or decrease in the measured internal resistance from the initial internal resistance exceeds the threshold value.

* * * * *